(12) United States Patent
Seo

(10) Patent No.: US 8,791,482 B2
(45) Date of Patent: Jul. 29, 2014

(54) LIGHT EMITTING DEVICE PACKAGE

(75) Inventor: Tae Won Seo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 199 days.

(21) Appl. No.: 12/949,414

(22) Filed: Nov. 18, 2010

(65) Prior Publication Data

US 2011/0121340 A1    May 26, 2011

(30) Foreign Application Priority Data

Nov. 23, 2009    (KR) .......................... 10-2009-0113141

(51) Int. Cl.
*H01L 33/58* (2010.01)
*H01L 33/64* (2010.01)

(52) U.S. Cl.
CPC .................................. *H01L 33/641* (2013.01)
USPC ................................ 257/98; 257/99; 257/100

(58) Field of Classification Search
USPC ............................................. 257/98, 99, 100
See application file for complete search history.

(56) References Cited

U.S. PATENT DOCUMENTS

| | | | |
|---|---|---|---|
| 6,835,960 B2 * | 12/2004 | Lin et al. ........................ | 257/81 |
| 2004/0041222 A1 * | 3/2004 | Loh ................................ | 257/433 |
| 2005/0194601 A1 | 9/2005 | Suenaga ......................... | 257/81 |
| 2006/0175716 A1 * | 8/2006 | Nakashima .................... | 257/787 |
| 2008/0298063 A1 * | 12/2008 | Hayashi ........................ | 362/249 |
| 2009/0001405 A1 * | 1/2009 | Choi .............................. | 257/99 |
| 2010/0072416 A1 | 3/2010 | Fujioka et al. | |

FOREIGN PATENT DOCUMENTS

| | | |
|---|---|---|
| JP | 10-051034 A | 2/1998 |
| JP | 2004-247658 A | 9/2004 |
| JP | 3891115 B2 | 3/2007 |
| JP | 2008-270709 | 11/2008 |
| JP | 2009-071090 | 4/2009 |
| JP | 2011-023460 A | 2/2011 |
| KR | 10-2009-0088134 A | 8/2009 |
| TW | 200423420 A * | 11/2004 |
| WO | WO 2009/031084 A1 | 3/2009 |

OTHER PUBLICATIONS

Korean Notice of Allowance dated May 11, 2012 issued in Application No. 10-2009-0113141.

* cited by examiner

*Primary Examiner* — Robert Carpenter
(74) *Attorney, Agent, or Firm* — KED & Associates LLP

(57) ABSTRACT

Disclosed is a light emitting device package. The light emitting device package includes a package body, a light emitting device installed in a cavity of the package body, an encapsulation layer to seal the light emitting device, and an electrode connected to the light emitting device. The package body includes a material having thermal conductivity lower than thermal conductivity of a material constituting the encapsulation layer.

20 Claims, 4 Drawing Sheets

LIGHT EMITTING DEVICE PACKAGE

BACKGROUND

The present embodiment relates to a light emitting device package.

A light emitting diode (LED) is a semiconductor light emitting device that converts current into light.

A wavelength of light emitted from the LED may vary depending on a semiconductor material used for manufacturing the LED. This is because the wavelength of the emitted light varies depending on the energy difference between valance band electrons and conduction band electrons, that is, the bandgap of the semiconductor material.

The LED can generate light having high brightness, so that the LED has been extensively used as a light source for a display device, a vehicle, or a lighting device. In addition, the LED can represent a white color having superior light efficiency by employing luminescence materials or combining LEDs having various colors.

SUMMARY

Electrical energy applied to a light emitting diode is mainly converted into optical energy and heat energy. Accordingly, the present embodiment provides a light emitting device package capable of improving a heat dissipation characteristic of heat energy.

In addition, the present embodiment provides a light emitting device package capable of improving the characteristic thereof by improving the heat dissipation characteristic of the light emitting diode.

According to the present embodiment, a light emitting device package includes a package body, a light emitting device installed in a cavity of the package body, an encapsulation layer to seal the light emitting device, and an electrode connected to the light emitting device. The package body includes a material having thermal conductivity lower than thermal conductivity of a material constituting the encapsulation layer.

According to another embodiment, a light emitting device package includes a package body provide therein with a cavity, a plurality of electrodes provided in the cavity, a light emitting device electrically connected to the electrode in the cavity, a resin member placed on the light emitting device, and a lens part placed on the resin member. The package body includes a material having thermal conductivity lower than that of a material constituting the lens part.

According to the light emitting device package, the dissipation path of heat energy emitted from the light emitting diode can be provided. Accordingly, the heat dissipation characteristic can be improved.

DETAILED DESCRIPTION OF THE EMBODIMENTS

Figure 1:
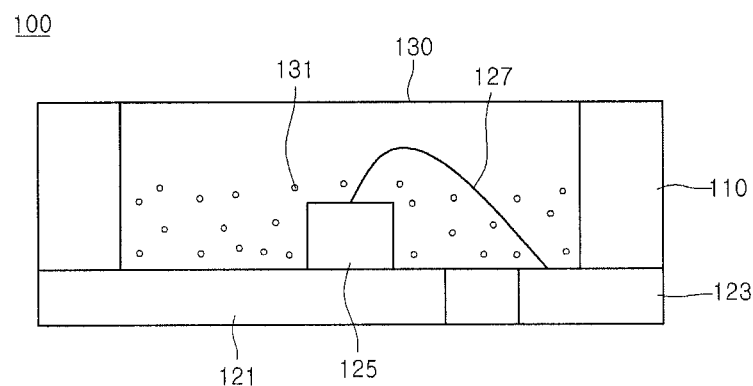
FIG. 1 is a side sectional view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device package according to embodiments will be described in detail with reference to accompanying drawings.

Figure 2:
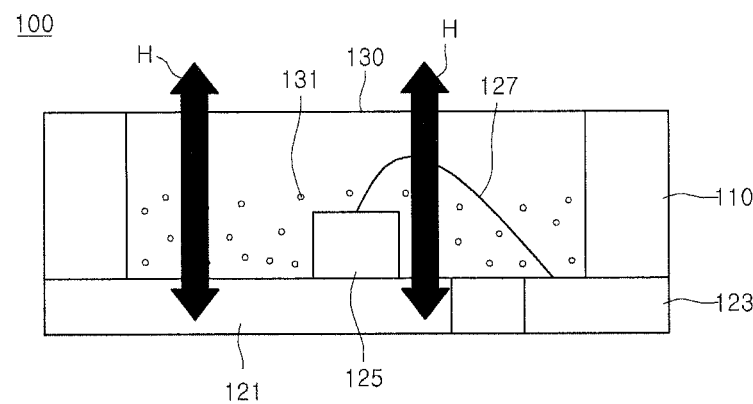
FIG. 2 is a view showing the heat dissipation characteristic of the light emitting device package according to the present embodiment.
Figure 3:
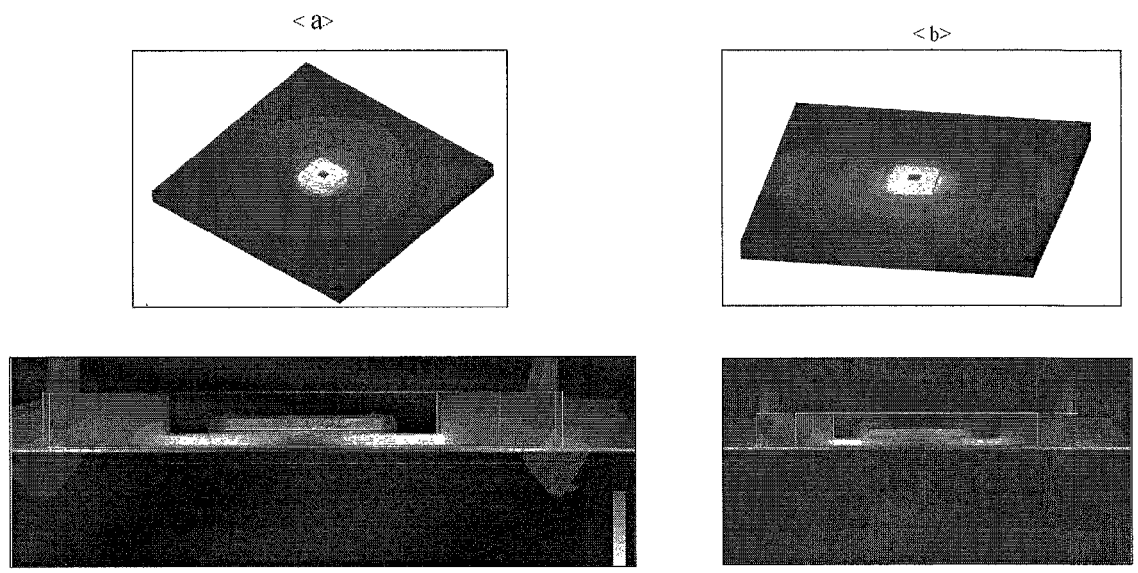
FIGS. 3A and 3B are a view showing a simulation result obtained in the comparison with a conventional light emitting device package in order to explain the heat dissipation effect of the light emitting device package according to the first embodiment.

FIG. 1 is a side sectional view showing a light emitting device package according to a first embodiment, FIG. 2 is a view showing a heat dissipation characteristic of the light emitting device package according to the present embodiment, and FIG. 3 is a view showing a simulation result obtained in the comparison with a conventional light emitting device package in order to explain the heat dissipation effect of the light emitting device package according to the first embodiment;

Referring to FIG. 1, a light emitting device package 100 includes first and second electrodes 121 and 123 formed on a substrate, a light emitting device 125 mounted on the first electrode 121, and a package body 110 surrounding the light emitting device 125 at an upper portion of the substrate.

An encapsulation layer 130 is provided in a cavity of the package body 110 to seal the light emitting device 125, and a phosphor 131 is contained in the encapsulation layer 130. In other words, the cavity forms a predetermined space in the package body 110, and the light emitting device 125 and the encapsulation layer 130 are placed in the cavity.

The first and second electrodes 121 and 123 are configured to connect to anode and cathode terminals of the light emitting device 125, respectively. The first and second electrodes 121 and 123 may be formed through a printing scheme. The first and second electrodes 121 and 123 are electrically insulated from each other, and pass through the package body 110.

The first and second electrodes 121 and 123 can reflect light emitted from the light emitting device 125 to increase light efficiency. According to the embodiment, the first and second electrodes 121 and 123 dissipate heat emitted from the light emitting device 125. The first and second electrodes 121 and 123 include metallic material including copper or aluminum representing superior electrical conductivity.

The light emitting device 125 may include a lateral type light emitting device in which both of an N side electrode layer and a P side electrode layer are provided on a top surface of a light emitting device structure, a flip-chip type light emitting device in which both of the N side electrode layer and the P side electrode layer are provided on a bottom surface of the light emitting device structure, or a vertical type light emitting device in which the N side electrode layer and the P side electrode layer are provided on the top and bottom surfaces of the light emitting device structure, respectively.

Although FIG. 1 shows a vertical type light emitting device, an N side electrode layer of the light emitting device 125 is electrically connected to the first electrode 121 through a wire 127, and a P side electrode layer of the light emitting device 125 makes contact with the second electrode 123. For example, the light emitting device 125 may include a light emitting diode including an N type semiconductor layer, an active layer, and a P type semiconductor layer.

The package body 110 including the cavity is formed on the first and second electrodes 121 and 123 while surrounding the light emitting device 125. If the internal surface of the package body 110, that is, the inner peripheral surface forming the cavity has a predetermined inclination, the reflection of light emitted from the light emitting device 125 is increased, so that light emission efficiency can be improved. In particular, the package body 110 includes a material having low thermal conductivity, and materials of the package body 110 are selected based on materials constituting the encapsulation layer 130.

Heat emitted according to the driving of the light emitting device 125 may be dissipated by using the difference in thermal conductivity between materials of the package body 110 and the encapsulation layer 130. For example, the package body 110 may constitute a material having thermal conductivity that is at least 10 W/m less than the thermal conductivity of a material of the encapsulation layer 130.

Preferably, the package body 110 may have thermal conductivity that is 0.01 W/m·k less than the thermal conductivity of a material constituting the encapsulation layer 130.

Therefore, heat generated from the light emitting device 125 may be transferred to the first and second electrodes 121 and 123 having high thermal conductivity and emitted in the upward direction, rather than transferred to the package body 110 having low thermal conductivity.

In other words, heat transferred to the encapsulation layer 130 is transferred to the first and second electrodes 121 and 123 having thermal conductivity higher than that of the encapsulation layer 130, so that heat dissipation property can be improved.

Therefore, a heat transfer path is formed by using the difference in thermal conductivity between the materials of the package body 110 and the encapsulation layer 130, and the heat dissipation characteristic can be improved through the heat transfer path.

In the light emitting device package according to the present embodiment, the heat transfer path is marked as "H" of FIG. 2, and emitted heat under the encapsulation layer 130 is transferred in the upward direction of the light emitting device 125 and transferred to the first and second electrodes 121 and 123 under the light emitting device 125, rather than transferred to the package body 110 having lower thermal conductivity.

An experimental result for the above structure is shown in FIGS. 3A and 3B. FIG. 3A shows a simulation result of a conventional light emitting device package in which an encapsulation layer includes silicon and a package body includes synthetic resin so that the encapsulation layer and the package body have thermal conductivity similar to each other. FIG. 3B shows a simulation result of the light emitting device package according to the present embodiment including the encapsulation layer 130 including a material having thermal conductivity that is at least 10 W/m·k greater than the thermal conductivity of a material constituting the package body 110.

According to the experimental result, in the case of the conventional light emitting device package, the peak temperature is represented as about 93.4° C., and the thermal resistance is represented as about 68.4[K/W]. In contrast, in the case of the light emitting device package according to the present embodiment, the peak temperature is represented as about 74° C., and the thermal resistance is represented as about 49[K/W].

As shown in FIGS. 3A and 3B, the thermal transfer path may be recognized. In the case of the conventional light emitting device package, an excessively small amount of heat is dissipated to the outside through an upper portion of the encapsulation layer, and the heat dissipation is concentrated on a metallic electrode.

In contrast, in the case of the light emitting device package according to the present embodiment, heat dissipation simultaneously occurs toward the metallic electrode and toward the outside through the upper portion of the encapsulation layer 130. In other words, when comparing with the package body 110 including only metal, the package body 110, which includes a material having thermal conductivity at least 10 W/m·k less than the thermal conductivity of the encapsulation layer 130, represents a superior heat characteristic.

Figure 4:
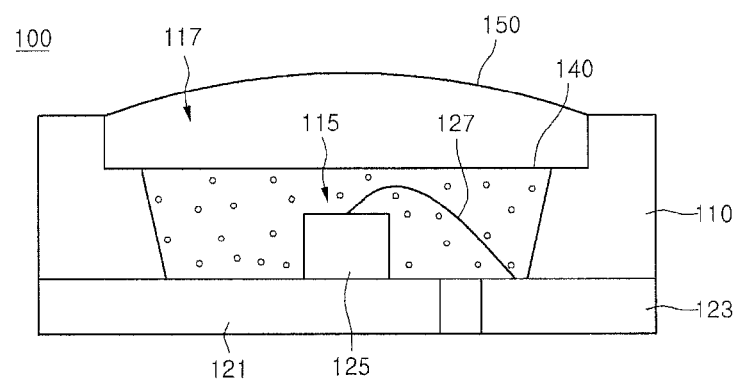
FIG. 4 is a side sectional view showing a light emitting device package according to a second embodiment.

FIG. 4 is a side sectional view showing a light emitting device package according to a second embodiment. In the following description about the second embodiment, structures and components the same as those of the first embodiment will be not further described in order to avoid redundancy.

Referring to FIG. 4, the light emitting device package 100 includes a first cavity 115, a second cavity 117, a first electrode 121, a second electrode 123, a package body 110, a light emitting device 125, a resin member 140, and a lens part 150.

First ends of the first and second electrodes 121 and 123 may be provided in the first cavity 115 of the package body 110, and an inner peripheral wall of the first cavity 115 may be perpendicular or inclined with respect to a bottom surface of the first cavity 115. The light emitting device 125 may be provided in the first cavity 115, and may be provided on at least one electrode 121. The first electrode 121 may be electrically connected to the second electrode 123. In addition, a plurality of LED chips may be installed in the first cavity 115. In this case, the patterns of the first and second electrodes 121 and 123 may be changed.

The package body 110 may be provided therein with the second cavity 117, and the second cavity 117 is formed at an upper portion of the package body 110. The first cavity 115 is provided at a central lower portion of the second cavity 117. The diameter of the second cavity 117 may be greater than the diameter of an upper portion of the first cavity 115.

The space of the first cavity 115 and/or the second cavity 117 may be defined by the package body 110 and/or at least one electrode 121 and 123, and the space may have various shapes.

The resin member 140 is formed in the first cavity 115. The resin member 140 may include at least one phosphor and/or a diffusing agent, but the embodiment is not limited thereto. The phosphor may include a yellow, green, red, or blue phosphor. In addition, the surface of the resin member 140 may have a concave shape, a convex shape, or a flat shape. A predetermined pattern may be formed on the surface of the resin member 140.

The first cavity 115 and the second cavity 117 in the package body 110 may have the shape of a circular recess or a polygonal recess when viewed in a plan view. A part of light emitted from the light emitting device 125 may be reflected by a circumferential surface of the first cavity 115 or may be transmitted through the circumferential surface of the first cavity 115.

The package body 110 according to the second embodiment may include a material having low thermal conductivity. In other words, the package body 110 may include a material having thermal conductivity at least 10 W/m·k less than the thermal conductivity of a material constituting the lens part 150. Preferably, the package body 110 may have thermal conductivity 0.01 times larger than thermal conductivity of the material constituting the lens part 150.

The thermal conductivity of the lens part 150 may be identical to or higher than that of the resin member 140.

Heat emitted from the light emitting device 125 is transferred to the first and second electrodes 121 and 123 and the lens part 150 having higher thermal conductivity, rather than transferred to the package body 110 having lower thermal conductivity, so that the heat can be dissipated. In other words, similarly to the first embodiment, the package body 110 may include a material having thermal conductivity that is at least 10 W/m·k less than the thermal conductivity of a material constituting a member (for example, the lens part) provided in the cavity such that the heat dissipation path can be formed.

Therefore, the dissipation of the package body is achieved through the metallic electrodes 121 and 123 and the lens part 150, so that the heat dissipation path is formed in up and down directions of the light emitting device 125.

As described above, according to the present embodiment, the dissipation characteristic of heat emitted according to the driving of the light emitting device can be improved.

The light emitting device package according to the embodiment may serve as a lighting system such as a backlight unit, an indicator, a lamp or a streetlamp.

Hereinafter, applications of the disclosure will be described with reference to FIGS. 5 and 6.

Figure 5:
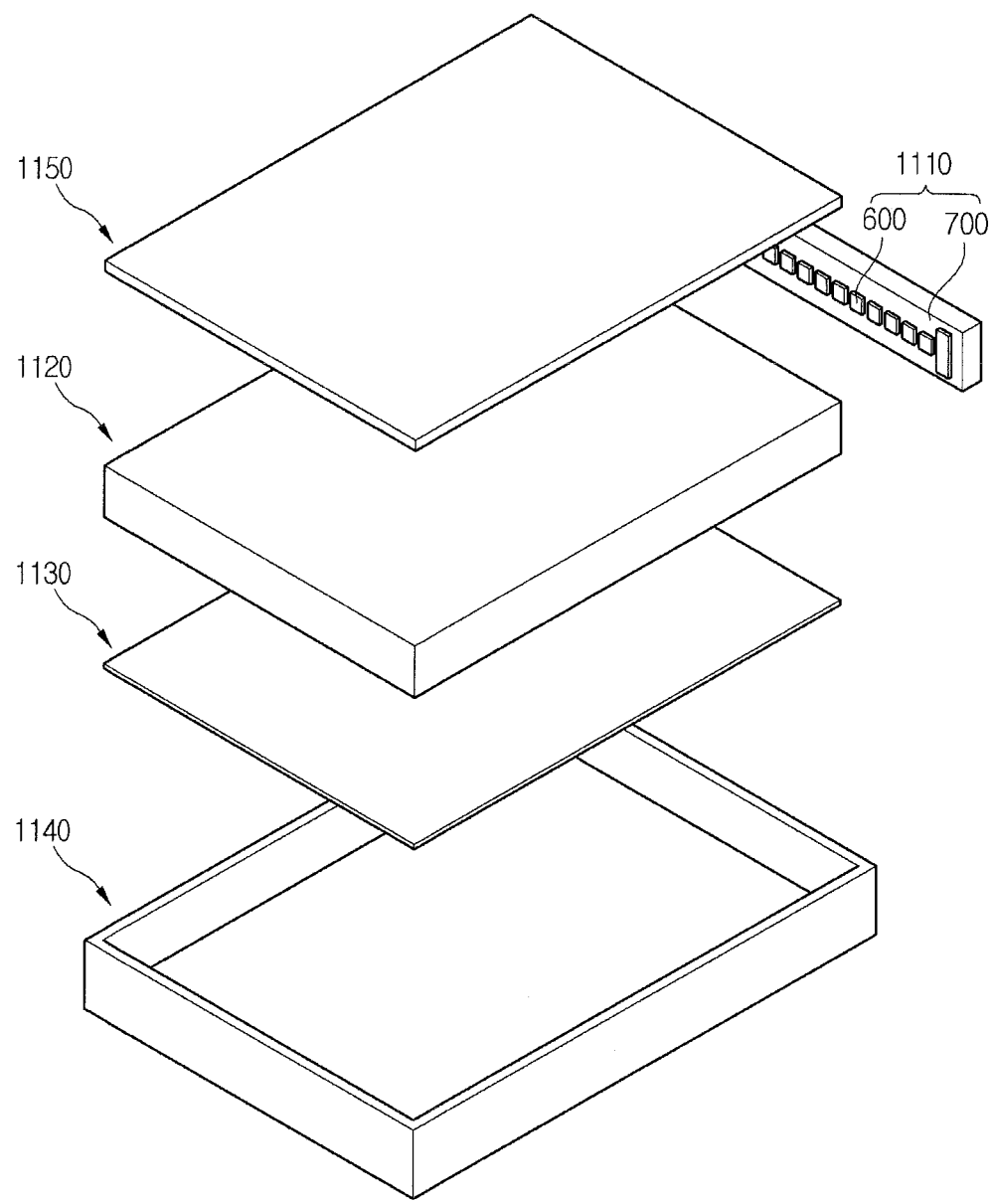
FIG. 5 is a perspective view showing a backlight unit including a light emitting device package according to the disclosure.

FIG. 5 is a perspective view showing a backlight unit 1100 including the light emitting device package according to the disclosure.

The backlight unit 1100 shown in FIG. 5 is an example of a lighting system and the embodiment is not limited thereto.

Referring to FIG. 5, the backlight unit 1100 includes a bottom cover 1140, a light guide member 1120 installed in the bottom cover 1140, and a light emitting module 1110 installed at one side or over the bottom surface of the light guide member 1120. In addition, a reflective sheet 1130 is disposed under the light guide member 1120.

The bottom cover 1140 has a box shape having an open top surface to receive the light guide member 1120, the light emitting module 1110 and the reflective sheet 1130 therein. In addition, the bottom cover 1140 may include metallic material or resin material, but the embodiment is not limited thereto.

The light emitting module 1110 may include a plurality of light emitting devices 600 installed over a substrate 700. The light emitting devices 600 provide the light to the light guide member 1120.

As shown in FIG. 5, the light emitting module 1110 is installed over at least one inner side of the bottom cover 1140 to provide the light to at least one side of the light guide member 1120.

In addition, the light emitting module 1110 can be provided under the light guide member 1120 in the bottom cover 1140 to provide the light toward the bottom surface of the light guide member 1120. Such an arrangement can be variously changed according to the design of the backlight unit 1100.

The light guide member 1120 is installed in the bottom cover 1140. The light guide member 1120 converts the light emitted from the light emitting module 1110 into the surface light to guide the surface light toward a display panel (not shown).

The light guide member 1120 may include a light guide plate. For instance, the light guide plate may include one of acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected over the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmissive plate or a transmissive film including phosphors.

The reflective sheet 1130 can be disposed under the light guide member 1120. The reflective sheet 1130 reflects the light, which is emitted through the bottom surface of the light guide member 1120, toward the light exit surface of the light guide member 1120. The reflective sheet 1130 may include resin material having a high reflectance, such as PET, PC or PVC resin, but the embodiment is not limited thereto.

Figure 6:
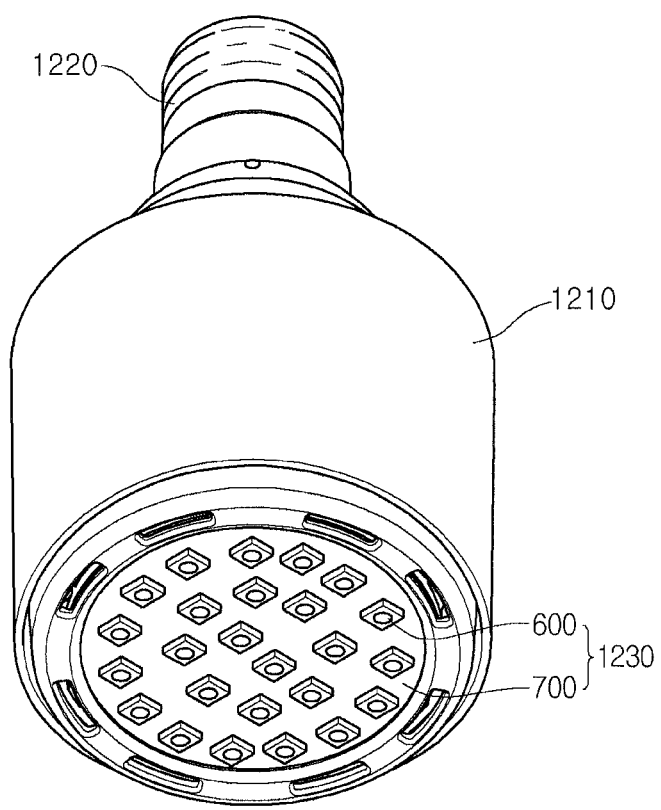
FIG. 6 is a view showing a lighting system including a light emitting device according to the present invention.

FIG. 6 is a perspective view showing a lighting system 1200 including the light emitting device according to the disclosure. The lighting system 1200 shown in FIG. 6 is only one example and the embodiment is not limited thereto.

Referring to FIG. 6, the lighting system 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device 600 installed over the substrate 700.

The substrate 700 includes an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 700 can be coated with a color, such as a white color or a silver color, to effectively reflect the light.

At least one light emitting device 600 can be installed over the substrate 700.

Each light emitting device 600 may include at least one LED (light emitting diode). The LED may include a colored LED that emits the light having the color of red, green, blue or white and a UV (ultraviolet) LED that emits UV light.

The light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 6, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

The backlight unit 1100 and the lighting system 1200 of FIGS. 5 and 6 include the light emitting modules 1110 and 1230 including the light emitting device package of FIGS. 1 to 4, so that superior light efficiency can be acquired.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body;
   a light emitting device in a cavity of the package body;
   a resin layer for covering the light emitting device; and
   an electrode connected to the light emitting device, wherein the electrode includes a first electrode and a second electrode,
   wherein the package body includes a material having thermal conductivity lower than thermal conductivity of a material constituting the resin layer,
   wherein a difference in thermal conductivity between materials of the package body and the resin layer is at least 10 W/m·k,
   wherein the package body is disposed on the first and the second electrodes such that a bottom surface of the package body directly contacts an upper surface of the first electrode and an upper surface of the second electrode,
   wherein an upper surface of the resin layer is coplanar with an upper surface of the package body, and
   wherein a side surface of the package body is coplanar with side surfaces of the first electrode and the second electrode.

2. The light emitting device package of claim 1, wherein the resin layer is in the cavity of the package body.

3. The light emitting device package of claim 1, wherein the electrode has thermal conductivity higher than thermal conductivity of the resin layer.

4. The light emitting device package of claim 1, wherein the electrode is attached to a lower portion of the light emitting device.

5. The light emitting device package of claim 1, wherein the electrode includes an alloy of copper or aluminum.

6. A lighting system comprising a light emitting module including a substrate and a light emitting device package claimed in claim 1 and provided on the substrate.

7. The light emitting device package of claim 1, wherein an inner surface of the package body is disposed in a vertical direction of the electrode.

8. A light emitting device package comprising:
   a package body;
   a light emitting device in a cavity of the package body;
   a resin layer for covering the light emitting device;
   a lens part on the resin layer; and
   an electrode connected to the light emitting device, wherein the electrode includes a first electrode and a second electrode,
   wherein the package body includes a material having thermal conductivity lower than thermal conductivity of a material constituting the resin layer,
   wherein a difference in thermal conductivity between materials of the package body and the resin layer is at least 10 W/m·k,
   wherein the cavity includes a first cavity filled with the resin layer and a second cavity filled with the lens part,
   wherein the package body is disposed on the first and the second electrodes such that a bottom surface of the package body directly contacts an upper surface of the first electrode and an upper surface of the second electrode,
   wherein an upper surface of the lens part is higher than an upper surface of the package body,
   wherein an inner surface of the package body has a stepped portion located over the first cavity, and
   wherein a bottom surface of the lens part contacts an upper surface of the resin layer and the stepped portion.

9. The light emitting device package of claim 8, wherein the package body includes a material having thermal conductivity lower than thermal conductivity of a material constituting the lens part.

10. The light emitting device package of claim 8, wherein a difference in thermal conductivity between materials of the package body and the lens part is at least 10 W/m·k.

11. The light emitting device package of claim 8, wherein the resin layer includes at least one kind of phosphor.

12. The light emitting device package of claim 8, wherein the first cavity and the second cavity have a step difference.

13. The light emitting device package of claim 8, wherein a difference in thermal conductivity between materials constituting the package body and the lens part is at least 0.01 W/m·k.

14. The light emitting device package of claim 8, wherein the resin layer transfers heat emitted from the light emitting device to the lens part and the electrode.

15. A light emitting device package comprising:
a package body;
a light emitting device in a cavity of the package body;
a resin layer for covering the light emitting device;
a lens part on the resin layer; and
an electrode connected to the light emitting device, wherein the electrode includes a first electrode and a second electrode,
wherein the package body includes a material having thermal conductivity lower than thermal conductivity of a material constituting the resin layer,
wherein a difference in thermal conductivity between materials of the package body and the resin layer is at least 0.01 W/m·k,
wherein the cavity includes a first cavity filled with the resin layer and a second cavity filled with the lens part,
wherein the package body is disposed on the first and the second electrodes such that a bottom surface of the package body directly contacts an upper surface of the first electrode and an upper surface of the second electrode,
wherein an upper surface of the lens part is higher than an upper surface of the package body,
wherein a side surface of the package body is coplanar with side surfaces of the first electrode and the second electrode.

16. The light emitting device package of claim 15, wherein the package body includes a material having thermal conductivity lower than thermal conductivity of a material constituting the lens part.

17. The light emitting device package of claim 15, wherein a difference in thermal conductivity between materials of the package body and the lens part is at least 10 W/m·k.

18. The light emitting device package of claim 15, wherein the resin layer includes at least one kind of phosphor.

19. The light emitting device package of claim 15, wherein an inner surface of the package body has a stepped portion located over the first cavity.

20. The light emitting device package of claim 19, wherein a bottom surface of the lens part contacts an upper surface of the resin layer and the stepped portion.

* * * * *